(12) United States Patent
Mistretta et al.

(10) Patent No.: US 6,487,435 B2
(45) Date of Patent: Nov. 26, 2002

(54) MAGNETIC RESONANCE ANGIOGRAPHY USING UNDERSAMPLED 3D PROJECTION IMAGING

(75) Inventors: Charles A. Mistretta; Andrew V. Barger; Walter F. Block, all of Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/767,757

(22) Filed: Jan. 23, 2001

(65) Prior Publication Data

US 2001/0027262 A1 Oct. 4, 2001

Related U.S. Application Data

(63) Continuation-in-part of application No. 09/600,433, filed as application No. PCT/US98/26523 on Dec. 11, 1998.
(60) Provisional application No. 60/081,409, filed on Apr. 10, 1998.

(51) Int. Cl.$^7$ .................................................. A61B 5/05
(52) U.S. Cl. ........................ 600/420; 600/415; 600/410; 600/407; 600/419; 324/307; 324/309
(58) Field of Search ................................ 324/307, 309; 600/415, 420, 407, 419, 410

(56) References Cited

U.S. PATENT DOCUMENTS

| | | | | |
|---|---|---|---|---|
| 4,908,578 A | * | 3/1990 | Van Liere | 324/309 |
| 5,243,284 A | * | 9/1993 | Noll | 324/309 |
| 5,810,726 A | * | 9/1998 | Van Vaals et al. | 600/410 |
| 6,230,040 B1 | * | 5/2001 | Wang et al. | 600/415 |

* cited by examiner

Primary Examiner—Marvin M. Lateef
Assistant Examiner—Devaang Shah
(74) Attorney, Agent, or Firm—Quarles & Brady, LLP

(57) ABSTRACT

A 3D projection reconstruction pulse sequence is employed to acquire CEMRA images. In one application of the invention an undersampled, high resolution abdominal CEMRA image is acquired in a single breathhold. In another application of the invention a series of undersampled image frames are acquired during a CEMRA dynamic study Each image is produced by combining peripheral k-space data from adjacent image frames with the central and peripheral k-space data of an acquired image frame.

23 Claims, 6 Drawing Sheets

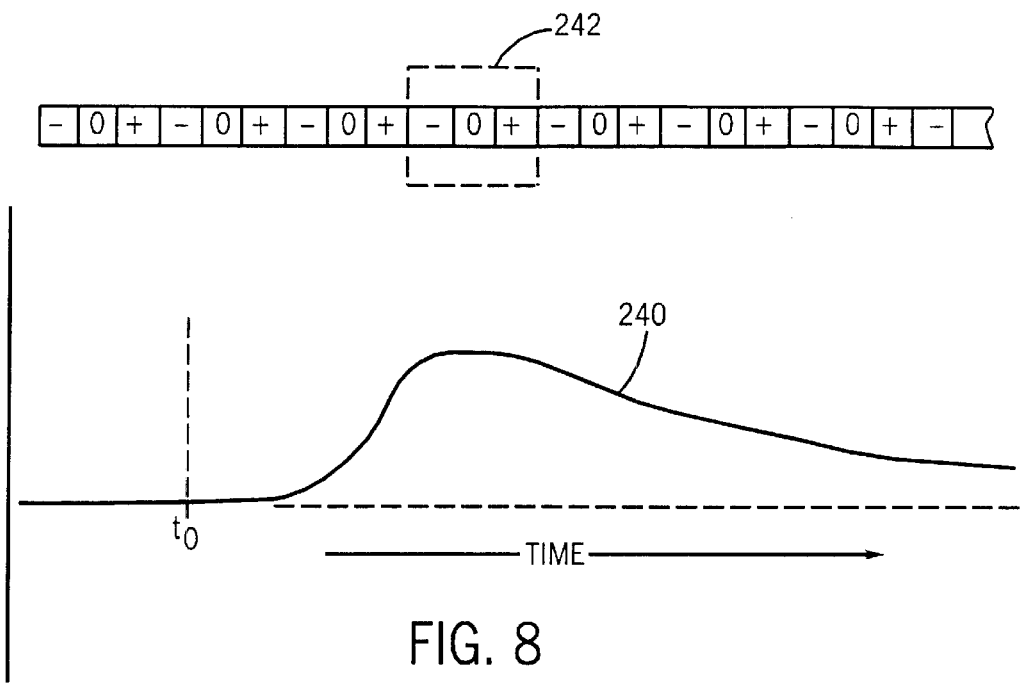
FIG. 8
FIG. 9
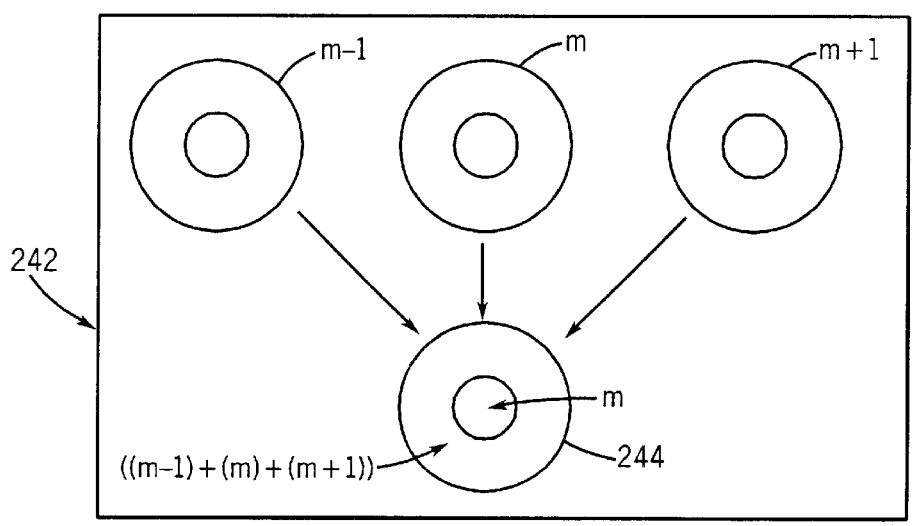

MAGNETIC RESONANCE ANGIOGRAPHY USING UNDERSAMPLED 3D PROJECTION IMAGING

CROSS-REFERENCE TO RELATED APPLICATIONS

This application is a continuation-in-part of U.S. application Ser. No. 09/600,433 filed on Jul. 14, 2000 which is the national phase of PCT application US98/26523 filed on Dec. 11, 1998, which has the benefit of earlier filed U.S. provisional application No. 60/081,409 file on Apr. 10, 1998.

STATEMENT REGARDING FEDERALLY SPONSORED RESEARCH

This invention was made with United Status Government support awarded by the National Institute of Health: NIH Grant No. HL62425. The United States government has certain rights in this invention.

BACKGROUND OF THE INVENTION

The field of the invention is magnetic resonance angiography ("MRA"), and particularly, studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Earlier images in the sequence may not have sufficient contrast in the suspect vasculature, and later images may become difficult to interpret as the contrast agent reaches veins and diffuses into surrounding tissues. Subtractive methods such as that disclosed in U.S. Pat. No. 4,204,225 entitled "Real-Time Digital X-ray Subtraction Imaging" may be used to significantly enhance the diagnostic usefulness of such images.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. Each measurement is referred to in the art as a "view" and the number of views determines the resolution of the image. The resulting set of received NMR signals, or views, or k-space samples, are digitized and processed to reconstruct the image using one of many well known reconstruction techniques. The total scan time is determined in part by the number of measurement cycles, or views, that are acquired for an image, and therefore, scan time can be reduced at the expense of image resolution by reducing the number of acquired views.

The most prevalent method for acquiring an NMR data set from which an image can be reconstructed is referred to as the "Fourier transform" imaging technique or "spin-warp" technique. This technique is discussed in an article entitled "Spin-Warp NMR Imaging and Applications to Human Whole-Body Imaging", by W. A. Edelstein et al., Physics in Medicine and Biology, Vol. 25, p. 751–756 (1980). It employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan. In a three-dimensional implementation (3DFT) a third gradient ($G_z$) is applied before each signal readout to phase encode along the third axis. The magnitude of this second phase encoding gradient pulse $G_z$ is also stepped through values during the scan. These 2DFT and 3DFT methods sample k-space in a rectilinear pattern.

To enhance the diagnostic capability of MRA a contrast agent such as gadolinium can be injected into the patient prior to the MRA scan. As described in U.S. Pat. No. 5,417,213 the trick with this contrast enhanced (CE) MRA method is to acquire the central k-space views at the moment the bolus of contrast agent is flowing through the vasculature of interest. Collection of the central lines of k-space during peak arterial enhancement is key to the success of a CEMRA exam. If the central lines of k-space are acquired prior to the arrival of contrast, severe image artifacts can limit the diagnostic information in the image. Alternatively, arterial images acquired after the passage of the peak arterial contrast are sometimes obscured by the enhancement of veins. In many anatomic regions, such as the carotid or renal arteries, the separation between arterial and venous enhancement can be as short as 6 seconds.

The short separation time between arterial and venous enhancement dictates the use of acquisition sequences of either low spatial resolution or very short repetition times (TR). Short TR acquisition sequences severely limit the signal-to-noise ratio (SNR) of the acquired images relative to those exams in which longer TRs are possible. The rapid acquisitions required by first pass CEMRA methods thus impose an upper limit on either spatial or temporal resolution.

Successful CEMRA of the abdomen requires that the scan be completed in a single breath-hold to limit respiratory artifacts. In conventional "Fourier" imaging, images of high resolution and large field-of-view (FOV) can be acquired quickly in the readout gradient direction, but spatial resolution and FOV in the other two dimensions are proportional to the number of phase encoded views acquired. Clinical MRA of the abdomen relies on a scout scan to properly identify a very limited region of interest, which is then acquired with non-isotropic resolution. This method increases the time and skill necessary to perform the exam. In addition, the non-isotropic resolution and the limited FOV of the acquired images can also restrict the possibilities for post-processing the data set.

As indicated above, the acquisition of MRA data is timed such that the central region of k-space is acquired as the bolus of contrast agent arrives in the arteries of interest. The ability to time the arrival of contrast varies considerably and it is helpful in many applications to acquire a series of MRA images in a dynamic study which depicts the separate enhancement of arteries and veins. A temporal series of images is also useful for observing delayed vessel filling patterns caused by disease. This requirement has been partially addressed by acquiring a series of time resolved images using a 3D "Fourier" acquisition as described by Korosec F., Frayne R, Grist T., Mistretta C., "Time-Resolved Contrast-Enhanced 3D MR Angiography", *Magn. Reson. Med.* 1996; 36:345–351 and in U.S. Pat. No. 5,713,358. However, with this method, the increased sampling rate of the center of k-space reduces the spatial resolution of the individual images in the time resolved series to about 75% of the resolution obtained when a single timed image is acquired during the passage of contrast.

There has been extensive recent work using multiple receiver coil arrays to increase imaging speed. In the SMASH technique described by Griswold, et al., "Simultaneous Acquisition Of Spatial Harmonics (SMASH)" *Magnetic Resonance In Medicine* 1999, Jun; 41(6):1235–45, multiple coils are carefully positioned in one of the Fourier phase encoding directions. Using knowledge of the coil sensitivities non-acquired phase encodings can be synthesized, thus increasing the rate at which images of a given resolution can be acquired, or increasing the resolution of images acquired at the same rate.

Another technique that can utilize arbitrary configurations of receiver coils is the SENSE technique described by Pruessmann et al., "Coil Sensitivity Encoding For Fast MRI", MRM 42:952–962 (1999). This technique can be viewed as a method for exploiting the benefits of small FOV imaging while imaging a large FOV. Basically, large phase encoding steps corresponding to a small FOV are used. This causes aliasing of signals from outside the supported FOV into the small supported FOV. The signal received by each of the receiver coils corresponding to overlapping aliased voxels in the image is a linear sum of the signals emanating from these voxels multiplied by the coil sensitivity for each of the voxels. By solving the linear equations provided by n receiver coils, n overlapping voxels can be separated, providing a maximum gain in speed by a factor of n. In practice the gain in speed is usually limited to a factor of two to three because of limitations set by the coil sensitivity profiles and noise considerations.

The SMASH and SENSE methods are characterized by a factor R representing the speed increase on the order of 2 to 3 for a given resolution and a factor g, on the order of 1–1.2 representing the increase in noise beyond what would be expected for a given imaging time.

There has also been recent work using projection reconstruction methods for acquiring MRA data. Projection reconstruction methods have been known since the inception of magnetic resonance imaging. Rather than sampling k-space in a rectilinear scan pattern as is done in Fourier imaging and shown in FIG. 2, projection reconstruction methods sample k-space with a series of views that sample radial lines extending outward from the center of k-space as shown in FIG. 3. The number of views needed to sample k-space determines the length of the scan and if an insufficient number of views are acquired, streak artifacts are produced in the reconstructed image.

Efforts have been made to acquire CEMRA images in shorter scan times using undersampled projection reconstruction scanning methods. A method for reducing the number of projections in a 3D acquisition by a factor of two has been reported by F. Boada, J. Christensen, J. Gillen, and K. Thulborn, "Three-Dimensional Projection Imaging With Half The Number Of Projections", *MRM* 37:470–477 (1997). In this method the acquisition is considered to occur over the upper and lower halves of a sphere using partial echoes. The projections associated with the lower half of the sphere are situated at angles intermediate between those of the upper half. A half Fourier algorithm is used to synthesize the data from the missing part of each echo, thus filling in the intermediate data in each hemisphere. This technique is not really undersampling, but instead, provides the missing data through a valid synthesis of the missing echo data. However, it does provide a factor of two increase in scanning speed relative to a 3D projection reconstruction sequence employing full echoes at all projection angles.

SUMMARY OF THE INVENTION

The present invention is an improved CEMRA method which employs a three-dimensional projection reconstruction method for sampling k-space. It has been discovered that the periphery of k-space can be substantially undersampled when using a 3D projection reconstruction technique for acquiring CEMRA data. Artifacts which are to be expected in the reconstructed images are surprisingly unobtrusive and undersampling by factors far in excess of 2 results in the acquisition of clinically useful images in less scan time.

Another aspect of the invention is the use of a 3D projection reconstruction acquisition method for the acquisition of a series of images in a dynamic CEMRA study. The acquisition of each image frame in the series can be shortened by undersampling the periphery of k-space. This undersampling increases the time resolution of the dynamic study without a loss in image resolution.

Yet another aspect of the present invention is a method for removing artifacts from images acquired in a dynamic CEMRA study using an undersampled, 3D, projection reconstruction acquisition. Successive image frames in the dynamic study are acquired with a different set of projection angles, or views. These are combined to form an image data set that completely samples k-space. Each set of projection views undersamples the peripheral region of k-space, but a complete image data set can be formed by combining peripheral k-space data acquired during adjacent image frames with the central region and peripheral region k-space samples at the desired time during the study.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 8 is a graphic representation of a CEMRA dynamic study using the projection reconstruction acquisitions of FIG. 7; and FIG. 9 is a pictorial representation of the method used to form image data sets from the acquisitions in the CEMRA dynamic study of FIG. 8.

DESCRIPTION OF THE PREFERRED EMBODIMENT

Figure 1:
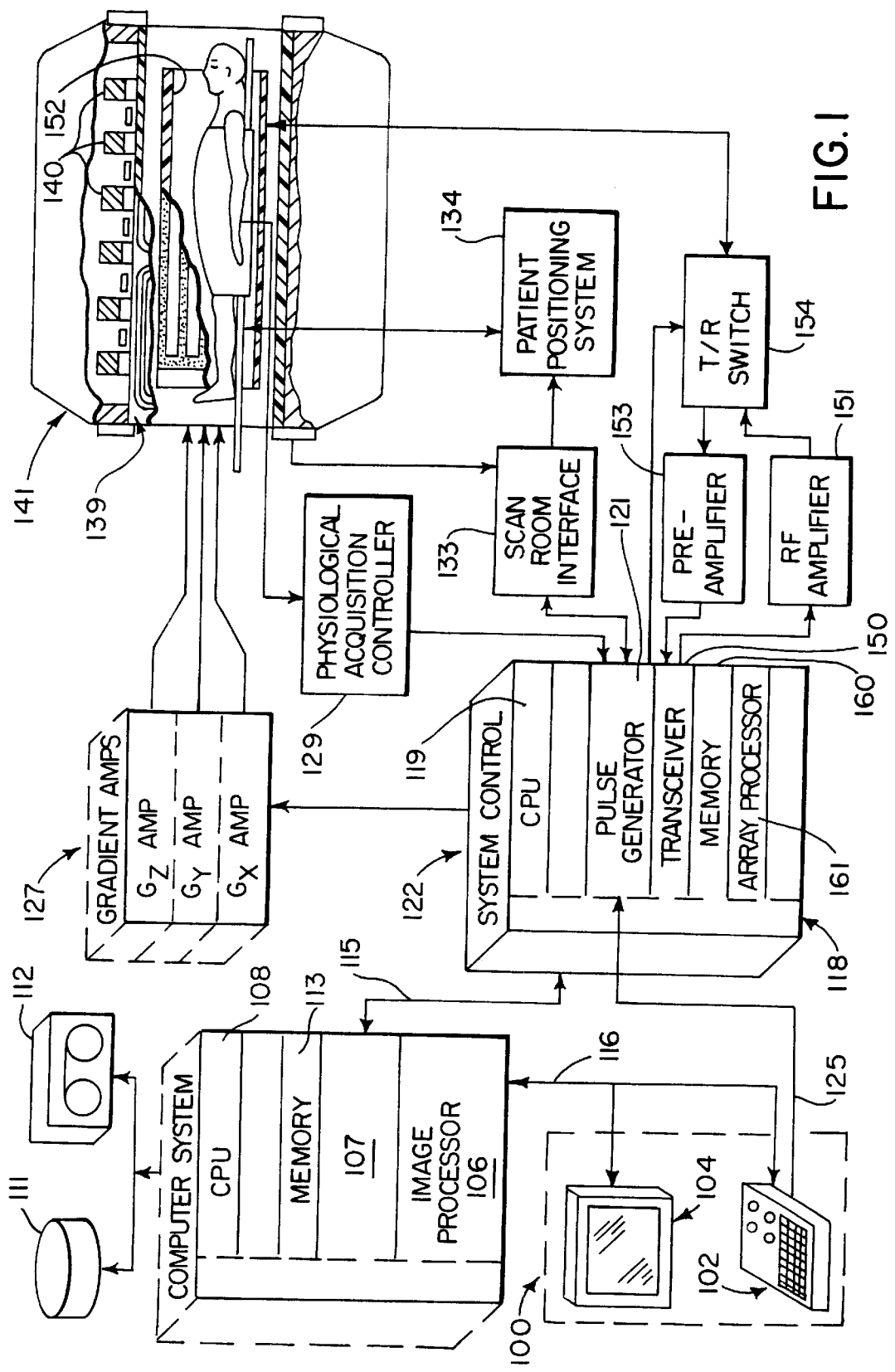
FIG. 1 is a block diagram of an MRI system which employs the present invention.
Figure 2:
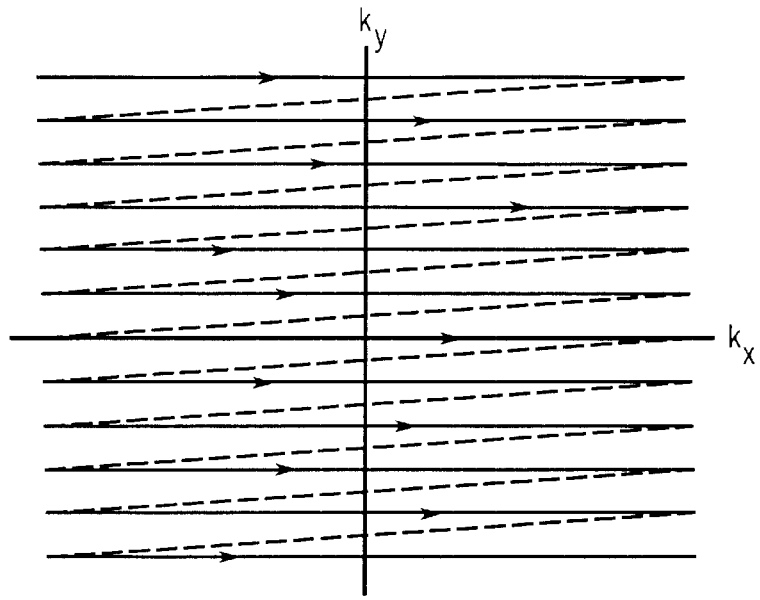
FIG. 2 is a graphic illustration of the manner in which k-space is sampled during a typical Fourier, or spin-warp, image acquisition using the MRI system of FIG. 1.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113 for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 4:
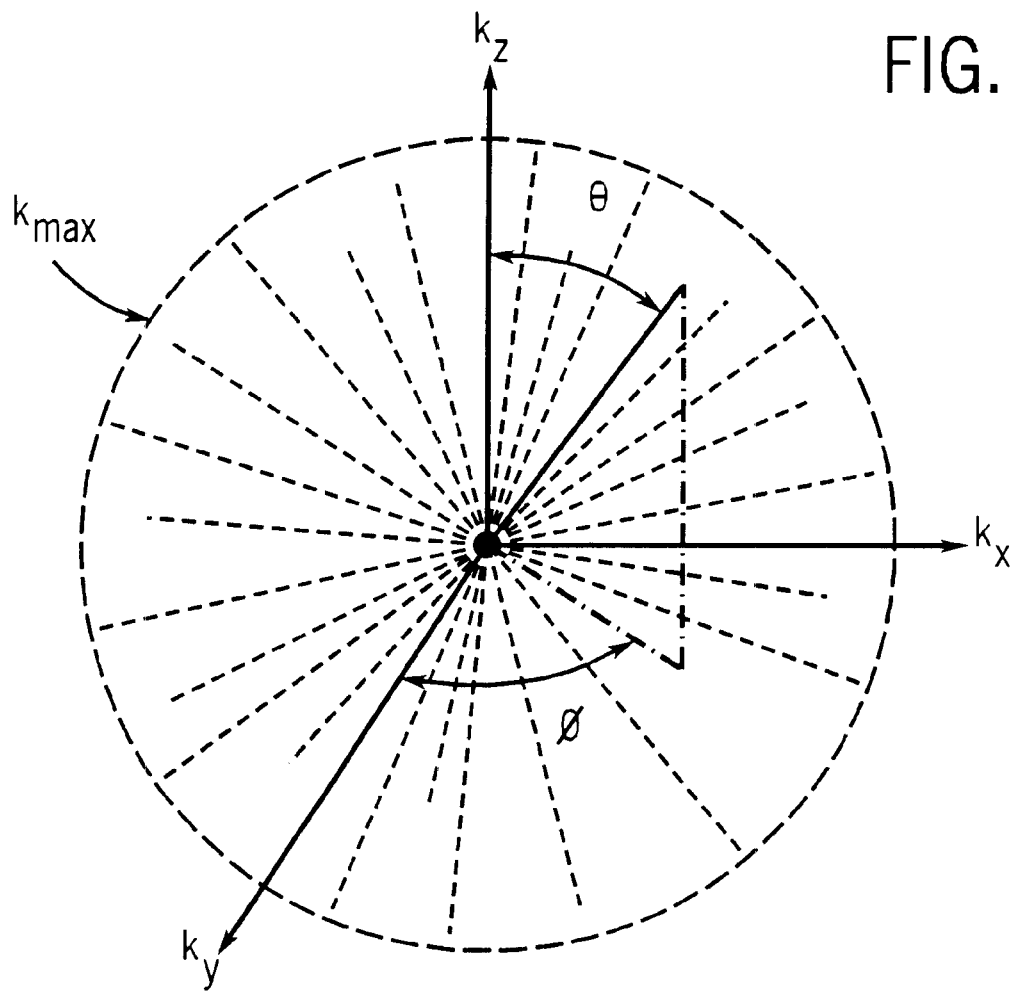
FIG. 4 is a graphic illustration of the angles that define scan parameters relative to a three-dimensional (3D) projection within an acquisition.

To practice a preferred embodiment of the invention NMR data is acquired in a 3D spherical k-space coordinate system, with the readout gradient direction defined by the angle θ from the $k_z$-axis and by the angle φ from the $k_y$-axis, as shown in FIG. 4. The sampling method consists of a series of evenly spaced projections with all projections going through the center of k-space. The maximum k-space radius value ($k_{max}$) determines the resolution in all three spatial directions of the resulting image. The radial sample spacing ($\Delta k_r$) determines the diameter (D) of the full field of view (FOV) of the reconstructed image. The full FOV image may be reconstructed without artifacts if the Nyquist condition is met, $\Delta k_\theta$, $\Delta k_\phi \leq \Delta k_r$. If this condition is not satisfied, however, alias-free reconstruction still occurs within a reduced diameter (d) that is less than the full FOV (D). If it is assumed that the projections are acquired evenly spaced ($\Delta k_\theta = \Delta k_\phi = \Delta k_r$), then the surface area A at $k_{max}$ associated with a projection is $$A = \Delta k^2 = \frac{2\pi}{N_p} k_{\max}^2 \tag{1}$$

where $N_p$ is the number of acquired views, or projections. Equation (1) determines $\Delta k$, by which the diameter (d) of the reduced FOV due to the angular spacing can be related to the full FOV diameter D as follows:

$$\frac{d}{D} = \frac{2}{N_R} \sqrt{\frac{N_P}{2\pi}}$$

where $N_R$ is the matrix size (i.e. number of samples during the signal readout) across the FOV. In the image domain, a well-constructed reduced FOV appears centered around each object even if the Nyquist condition is not met. However, radial streak artifacts from outside can enter the local FOV. The condition that k-space be fully sampled, or d=D, requires that the number of sampled projections be:

$$N_P = \frac{\pi}{2} N_R^2. \tag{2}$$

If $N_R$=256 samples are acquired during the readout of each acquired NMR signal, for example, the number of projections $N_p$ required to meet the Nyquist condition is around 103,000.

Figure 5:
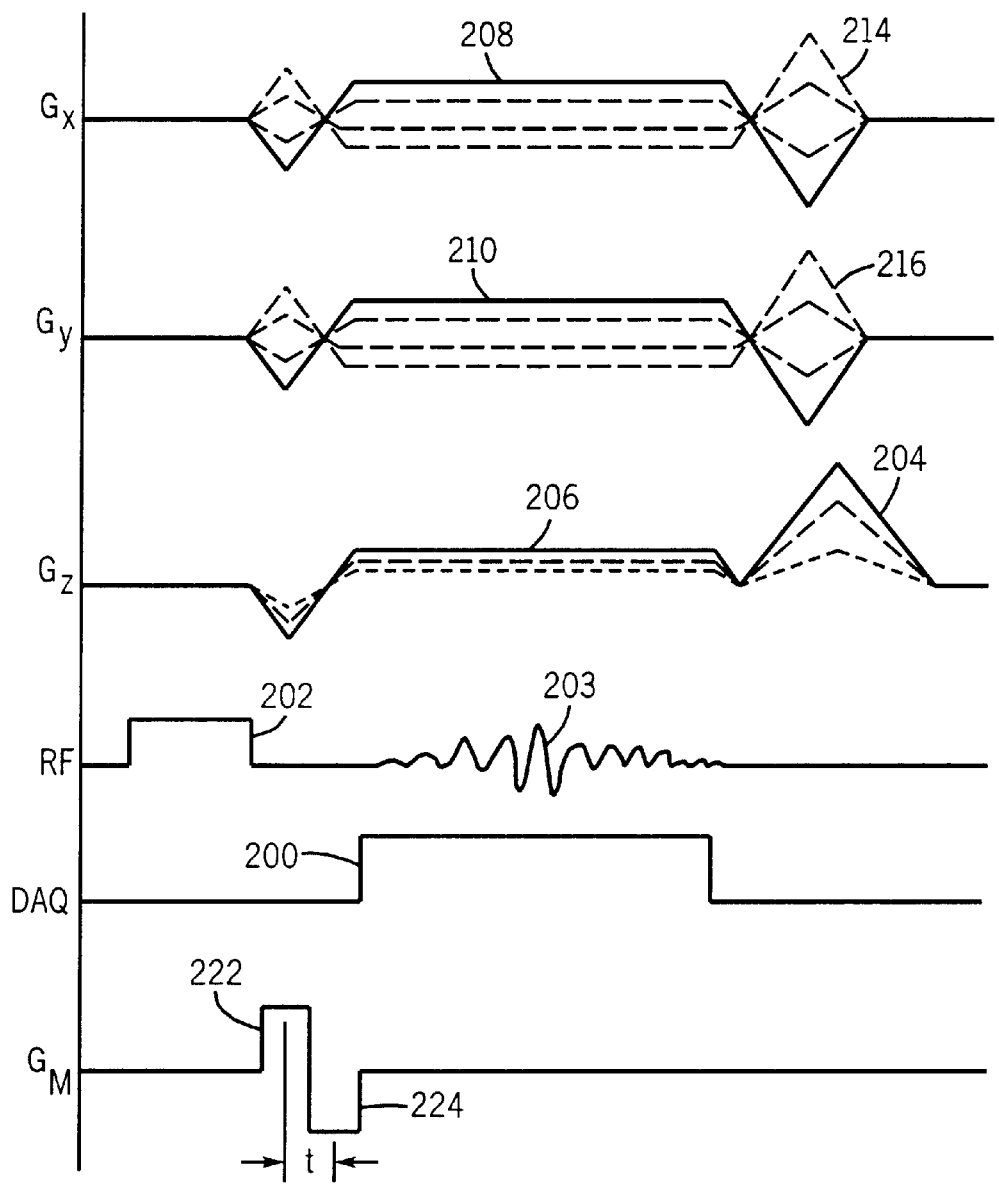
FIG. 5 is a graphic illustration of a preferred pulse sequence for directing the MRI system of FIG. 1 to acquire a 3D projection reconstruction image.

A pulse sequence used to acquire data as 3D projections is shown in FIG. 5. The sequence is implemented on the above described MRI system equipped with a high-performance gradient subsystem (40 mT/m maximum amplitude and 150 T/m/sec maximum slew rate). Either full-echo or partial-echo readouts can be performed during a data acquisition window 200. If partial echo is chosen, the bottom half of k-space ($k_z$<0) is only partially acquired. Because of the large FOV in all directions, a non-selective 200 μs radio-frequency (RF) pulse 202 can be used to produce transverse magnetization throughout the image FOV. Relative to slab-selective excitation, this scheme provides a more uniform flip angle across the volume, requires lower RF power, and deposits less energy into the patient.

A gradient-recalled NMR echo signal 203 is produced by spins in the excited FOV and acquired in the presence of three readout gradients 206, 208 and 210. Since a slab-select gradient is not required, the readout gradient waveforms $G_x$, $G_y$, and $G_z$ have a similar form. This symmetry is interrupted only by the need to spoil the sequence, which is accomplished by playing a dephasing gradient lobe 204. The area of the dephasing lobe 204 is calculated to satisfy the condition $$\int_0^{T_R} (G_{dephase}(t) + G_{read}(t))dt = n \cdot k_{\max} \tag{3}$$

where n is an integer n≧2. Because the $G_z$ readout gradient 206 is always positive on the logical z-axis, the time required for the spoiling gradient 204 is minimized by playing the dephasing lobe 204 only on $G_z$. The $G_x$ and $G_y$ readout gradients 208 and 210 are rewound by respective gradient pulses 214 and 216 to achieve steady state.

The readout gradient waveforms $G_x$, $G_y$ and $G_z$ are modulated during the scan to sample radial trajectories at different θ and φ angles. The angular spacing of θ and φ are chosen such that a uniform distribution of k-space sample points occurs at the peripheral boundary ($k_{max}$) of the sampled k-space sphere. Although several methods of calculating the distribution are known, a method which evenly distributes the projections by sampling the spherical surface with a spiral trajectory, with the conditions of constant path velocity and surface area coverage is used. This solution also has the benefit of generating a continuous sample path, which reduces gradient switching and eddy currents. For N total projections, the equations for the gradient amplitude as a function of projection number n are:

$$G_z = \frac{2n-1}{2N} \tag{4}$$

$$G_x = \cos(\sqrt{2N\pi} \sin^{-1} G_z(n))\sqrt{1-G_{z(n)}^2} \tag{5}$$

$$G_y = \sin(\sqrt{2N\pi} \sin^{-1} G_z(n))\sqrt{1-G_{z(n)}^2}. \tag{6}$$

If a fully sampled image acquisition is to be performed, N is set to $N_p$ as defined above in equation (2) and a series of N=$N_p$ pulse sequences are performed. The readout gradient amplitudes for the $n^{th}$ pulse sequence in this series is given by equations (4), (5) and (6). While n can be indexed from 1 to N in monotonic order during the scan, it can be appreciated that other orders are possible.

After the scan is complete the data is saved in a raw, k-space image data set. In the preferred image reconstruction method, a regridding method is used to place the acquired data set on a 3D Cartesian grid. Such regridding methods are well known in the art and is described, for example, in J. Jackson et al, "Selection Of Convolution Function For Fourier Inversion Using Gridding," *IEEE Trans. Med. Imaging*, 10, 473–478, 1991. The resulting 3D array of k-space data are density compensated with a $\rho^2$ filter, where ρ is the k-space radius of the data point being compensated. The ρ=0 point is weighted according to the finite sphere of volume that it samples, similar to the correction proposed for 2D projection filters. The kernel used for the regridding process is either a simple triangle function, which is computationally very fast, or a Kaiser-Bessel function, which has the advantage of reducing aliased energy from the regridding process.

The data is then Fourier-transformed in all three directions into image space. If a partial echo was used for the acquisition, the missing data is synthesized with a 3D homodyne process such as that described by Noll and Nishimura, "Homodyne Detection In Magnetic Resonance Imaging," *IEEE Transactions on Medical Imaging*, Vol. 10, No. 2, June 1991 and in U.S. Pat. No. 5,243,284. The final images are divided by the Fourier transform of the convolution kernel to correct for low-frequency image intensity variations due to the regridding process.

It should be apparent to those skilled in the art that sampling trajectories other than the preferred straight line trajectory extending from one point on the k-space peripheral boundary, through the center of k-space to an opposite point on the k-space peripheral boundary may be used. As mentioned above, one variation is to acquire a partial NMR echo signal 203 which samples along a trajectory that does not extend across the entire extent of the sampled k-space volume. The missing samples are synthesized during the homodyne reconstruction described above. Another variation which is equivalent to the straight line projection reconstruction pulse sequence is to sample along a curved path rather than a straight line. Such pulse sequences are described, for example, in "Fast Three Dimensional Sodium Imaging", MRM, 37:706–715,1997 by F. E. Boada, et al.

There are also alternative methods for reconstructing a 3D image from the acquired 3D k-space image data set. One alternative is a filtered backprojection method such as that described by F. Natterer, "The Mathmatics of Computerized Tomography", Teubner, Stuttgart, 1986. This is a method commonly used to reconstruct x-ray CT images.

Phantom studies were performed with this 3D projection reconstruction acquisition method using a head coil and two carotid phantoms filled with water and Gadolinium, placed to occupy a 12 cm FOV. One carotid phantom had a 70 percent stenosis at the bifurcation. Since the artifacts from undersampling are object dependent, this arrangement was designed to mimic a contrast-enhanced angiography exam. Tests were done to verify the behavior of SNR with undersampling. Identical volumes were prescribed and scanned with a 30° RF flip angle, 32 kHz readout, 28 cm FOV and a full-echo 256 sample readout. The phantom filled the volume in the superior-inferior direction, but only 40% of the scan plane. The number (N) of acquired projections was varied from 24,000 down to 1,500. The 24,000 projection image was acquired with one signal average, and the number of signal averages was adjusted for other scans so that the total excitations equaled 24,000 in all the acquisitions.

The image data sets acquired with the different amounts of undersampling were each reconstructed separately. The mean signal level was calculated for each image. Two 24,000 projection scans were subtracted to obtain an estimate of the noise not related to projection artifact. In the un-subtracted images, the standard deviation of the region outside of the bright signal from the carotid phantoms was measured to determine the Rayleigh distributed noise $\sigma$, which is related to the standard deviation of the Gaussian distributed noise as $0.665\sigma$. The noise of each scan relative to that of the subtracted data set was then calculated and plotted.

Figure 6:
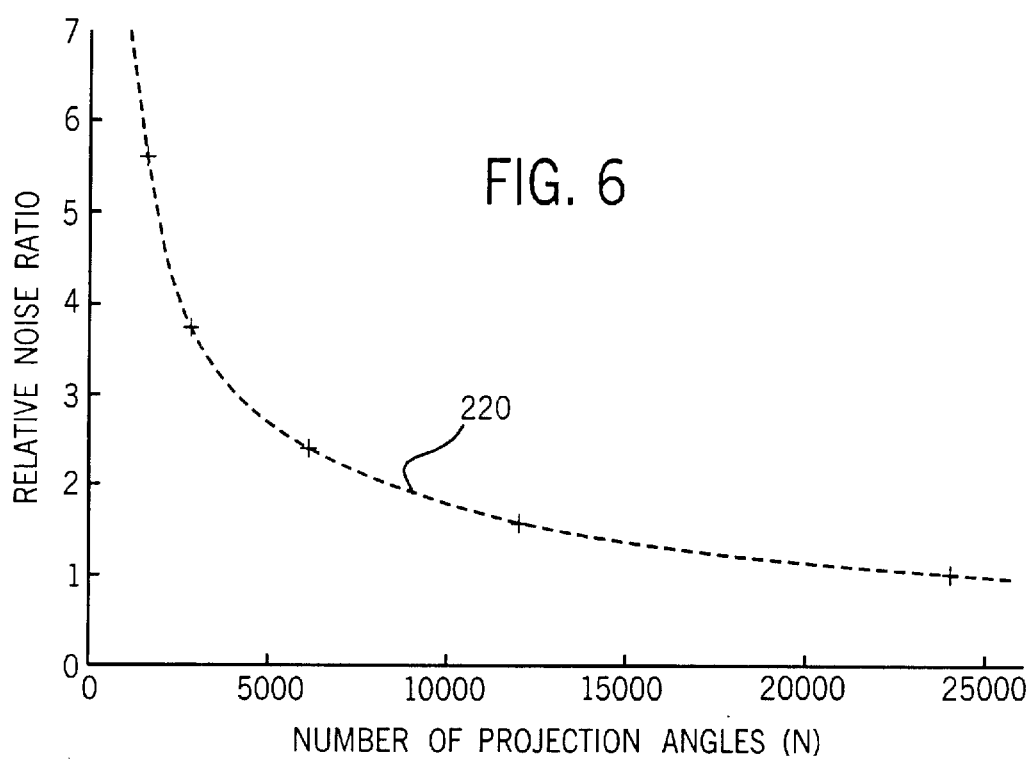
FIG. 6 is a graph illustrating the noise present in a CEMRA image due to undersampling during a scan with the pulse sequence of FIG. 5.

The measurements of noise for the reconstructed images are plotted in FIG. 6 as a function of the number (N) of projection angles (cross marks). Also shown is the curve $a/N_p^b$ indicated by dashed line 220, with the best fit values determined to be a=518 and b=0.62. As expected, the average measured signal for each data set was constant because the number of excitations was independent of the number of projection angles. In addition, the measured noise in the images increased as one would expect due to projection artifacts as N decreases. This decrease in SNR is independent of other factors that can affect the signal, such as voxel size or total data acquisition time.

What is surprising from this curve 220 is that the number of projection acquisitions (N) can be reduced substantially below the Nyquist condition ($N_p$) before the artifact noise becomes significant. The noise in the reconstructed image does not increase significantly over a base level until the number of projections is below 5,000 to 10,000. This is an undersampling factor of 10 to 20.

An abdominal image may be acquired using the undersampled, 3D projection reconstruction method in a single breathhold. An anterior-posterior phased array torso surface coil is used for signal reception and is placed to cover the abdomen. The pulse sequence of FIG. 5 is used and employs a full-echo acquisition resulting in a $T_R$ and $T_E$ of 3.9 ms and 1.3 ms respectively. The sampling bandwidth was ±62.5 kHz and a 30° RF flip angle is used. The scan uses 9,000 projections and samples a 38×38×38 cm volume with a 256 sample readout matrix ($N_R$). The total amount of contrast agent used is 0.3 mmol of gadopentetate dimeglumine (Magnevist; Schering AG, Berlin, Germany) per kilogram of body weight. A dose-timing scan is done using 2 ml of contrast injected at 2.0 ml/sec. A pre-contrast mask is then acquired in a single 35 second breath-hold, followed by the breath-hold contrast-enhanced acquisition with an injection of the remaining contrast agent, injected with an automated injector (Spectris; Medrad, Pittsburg, Pa.). The injection speed is 2.0 ml/sec to create a relatively constant bolus during the duration of the scan. The pre-contrast mask is subtracted from the contrast-enhanced acquisition in k-space and the resultant image data set is reconstructed as described above.

It is possible to obtain high-resolution, T1-weighted contrast-enhanced abdominal MRA images with broad field of view coverage in a single breath-hold. As long as a reasonable number of projections (N) are sampled, the artifact and noise penalties of undersampling k-space are not limiting for high SNR applications. In this 3D projection reconstruction acquisition, streak artifacts are only seen from objects with very coherent, long, sharp edges. Instead the undersampled energy appears as diffuse noise spread across the image. By Parseval's theorem, the unmeasured data results in error in the image proportional to the undersampled energy. We have found that as long as approximately 10–15 percent of the projections $N_p$ are sampled, the SNR penalty for abdominal contrast-enhanced applications is not limiting. An advantage of the present technique is that no special coils or receivers are needed, and the scan set-up and acquisition are very similar to conventional Fourier acquisitions.

The resolution of the image acquired with the 3D projection reconstruction method is determined by the readout resolution. In the example abdominal image a resolution of 1.5×1.5×1.5 mm for a voxel size of 3.4 mm$^3$ is achieved. The isotropic resolution of the resulting 3D image provides a number of advantages. These include the ability to view the image from any angle or through any plane without loss of resolution. This is significant because it has been shown that the sensitivity and specificity of abdominal contrast-enhanced 3D angiography is greatly improved by viewing multi-planar reformat in addition to viewing the MIP in the acquired plane. With the 3D projection reconstruction acquisition, there is no preferential scan plane and a large FOV, and thus the radiologist can retrospectively choose any oblique plane and obtain the same resolution.

The present invention may significantly alter the clinical acquisition and evaluation of MR angiography data. An abdominal exam using this technique requires only four scans which are:

(1) a 2D localizer from which the dose timing scan is prescribed, (2) a 2D dose timing scan, (3) a 3D projection mask acquisition, and (4) the 3D projection contrast-enhanced acquisition.

The placement of the imaging volume for the 3D projection acquisition requires simply centering the volume within the RF coil sensitivity region. The length of the scans with the above MRI system are 20 seconds for the localizer, 1 minute for the dose-timing scan, 35 seconds each for the 3D mask acquisition and 3D contrast-enhanced acquisition. With the addition of automated bolus detection, the second scan could be eliminated. Because no detailed scan volume placement is required at any point in the scan, this technique allows for abdominal contrast-enhanced MR studies to be done in a very short period of time.

In addition to straight forward undersampling during a 3D projection reconstruction CEMRA examination, further undersampling can be achieved when the 3D projection reconstruction method is used during a dynamic study. As described in U.S. Pat. No. 5,713,358, rather than precisely timing the arrival of contrast into the vasculature being imaged, the strategy of the CEMRA dynamic study is to acquire a series of images during administration of the contrast agent. The physician is then able to select which image in the series best depicts the vasculature of interest. In addition to image quality and resolution, an important criteria in a CEMRA dynamic study is the rate at which images can be acquired. This is referred to as time resolution, and studies with higher time resolution increase the probability that an image with peak contrast in the vasculature of interest will be acquired.

Figure 7:
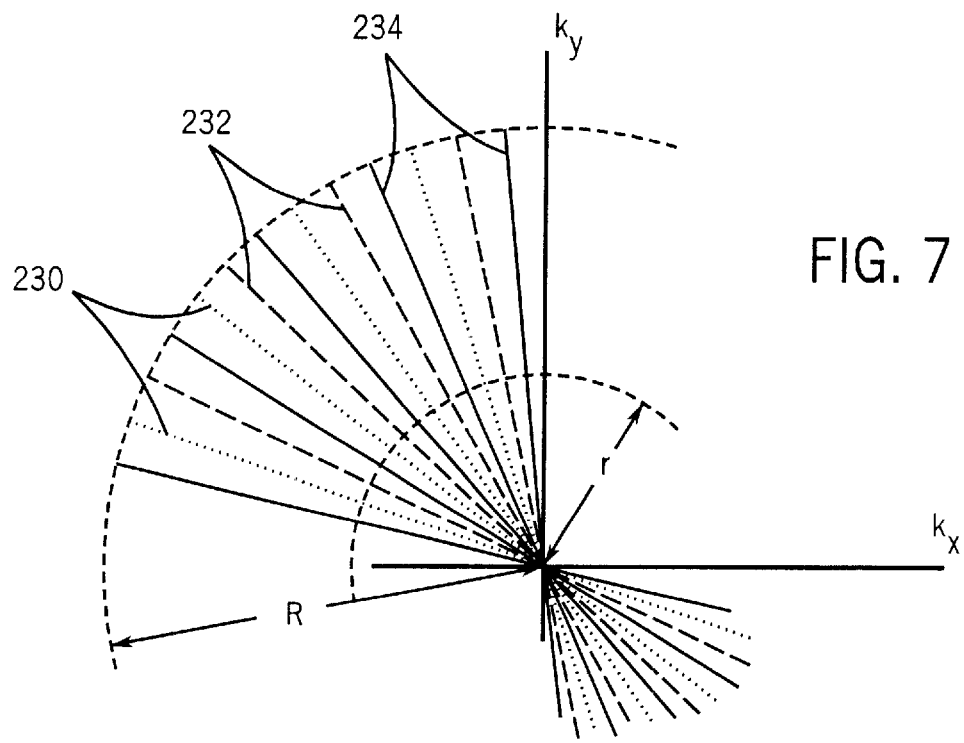
FIG. 7 is a pictorial representation of the k-space sampling produced by projection reconstruction acquisitions during a CEMRA dynamic study.

The 3D projection reconstruction acquisition may be employed to increase the time resolution of a CEMRA dynamic study without reducing image resolution and with minimal effect on image quality. Referring first to FIG. 7, the N projections required to fully sample a k-space volume having a radius R are divided into three sets of interleaved projection views. The sampling trajectories of the first set of projection views are indicated by dotted lines 230, the second set is indicated by dashed lines 232, and the third set by lines 234. Because they are interleaved with the other sets and evenly spaced around the center of k-space, each set of projections 230, 232 and 234 acquire an image data set that is fully sampled at a smaller radius r. In other words, each set of projection views 230, 232 and 234 fully samples the center region of k-space, but undersamples the peripheral region of k-space.

A CEMRA dynamic study which exploits the 3D projection reconstruction method is illustrated in FIG. 8, where the curve 240 indicates contrast enhancement in the vasculature of interest after a contrast agent is injected at time $t_0$. The pulse sequence of FIG. 5 is repeatedly performed beginning at a time prior to contrast arrival and lasting for a period of time well beyond the peak in signal contrast. The readout gradients are stepped through values as described above to sequentially acquire the first set of views 230 indicated by "0" in FIG. 8, then the second set of views 232 indicated by "+" in FIG. 8 and then the third set of views 234 indicated by in FIG. 8. This scan sequence is repeated throughout the dynamic study. It should be apparent that the time resolution of each view set 230, 232 and 234 is three times the time resolution of a complete, fully sampled acquisition comprised of all three view sets.

All of the k-space data sets acquired during the dynamic study are stored. Typically, a mask image is produced by combining the k-space samples from the three view sets 230, 232 and 234 acquired prior to contrast arrival and reconstructing an image as described above. The mask image may be subtracted from contrast enhanced images to remove non-vascular structures.

Referring particularly to FIGS. 8 and 9, a contrast enhanced image may be produced by first sliding a data window 242 to any point (m) along the data sets acquired during the dynamic study. As shown in FIG. 8, the data window 242 may, for example, be aligned with the peak in arterial enhancement, although it can be appreciated that the window location m may be centered on any set of views acquired during the dynamic study.

An image is reconstructed by combining the k-space data from the three sets of views 230, 232 and 234 within the data window 242. This is accomplished by using all of the k-space data in the center of view set m and the peripheral k-space data from adjacent view sets m−1 and m+1. The central region of the view set m is fully sampled and it accurately depicts the image enhancement occurring at its acquisition time during the study. The undersampled peripheral region surrounding the center is filled in with peripheral data from the adjacent view sets at m−1 and m+1. As a result, a fully sampled image data set 244 is formed which depicts the vasculature of interest at time m during the dynamic study.

As indicated above, many different images can be produced from the data sets 230, 232 and 234 acquired throughout the dynamic study. A single image may be produced at a selected time m during the study as described above, or a series of images can be produced by sliding the data window 242 to successive data sets. The mask image may be subtracted and one or more 2D projection images may be produced from the resulting 3D difference image. One of the advantages of the present method is that the image resolution is the same along all three axes so that a projection can be made in any direction selected by the physician.

The present invention may also be employed to produce a phase contrast MRA image. Referring again to FIG. 5, to produce a phase contrast MRA image, each acquired projection is motion sensitized by a bipolar motion encoding gradient $G_M$. As is well known in the art, a velocity encoding gradient $G_M$ is comprised of two gradient lobes 222 and 224 of equal size and opposite polarity. The motion encoding gradient $G_M$ can be applied in any direction and it is played out after transverse magnetization is produced by the RF excitation pulse 202 and before the NMR echo signal 203 is acquired. The motion encoding gradient $G_M$ imposes a phase shift to the NMR signals produced by spins moving in the direction of the gradient $G_M$ and the amount of this phase shift is determined by the velocity of the moving spins and the first moment of motion encoding gradient $G_M$. The first moment ($M_1$) is equal to the product of the area of gradient pulse 222 or 224 and the time interval (t) between them. The first moment $M_1$ is set to provide a significant phase shift, but not so large as to cause the phase to wrap around at high spin velocities.

To ensure that phase shifts in the acquired NMR signals 203 are due solely to spin motion, two acquisitions are made at each projection angle and at each motion encoding gradient value. One acquisition is performed with the bipolar gradient $G_M$ as shown in FIG. 5 and a second acquisition is made with the polarity of each gradient lobe 222 and 224 reversed. Two resulting phase images are subtracted to null any phase shifts common to both acquisitions. The phase shifts caused by spin motion are reinforced due to the reversal of motion encoding gradient polarity.

Figure 3:
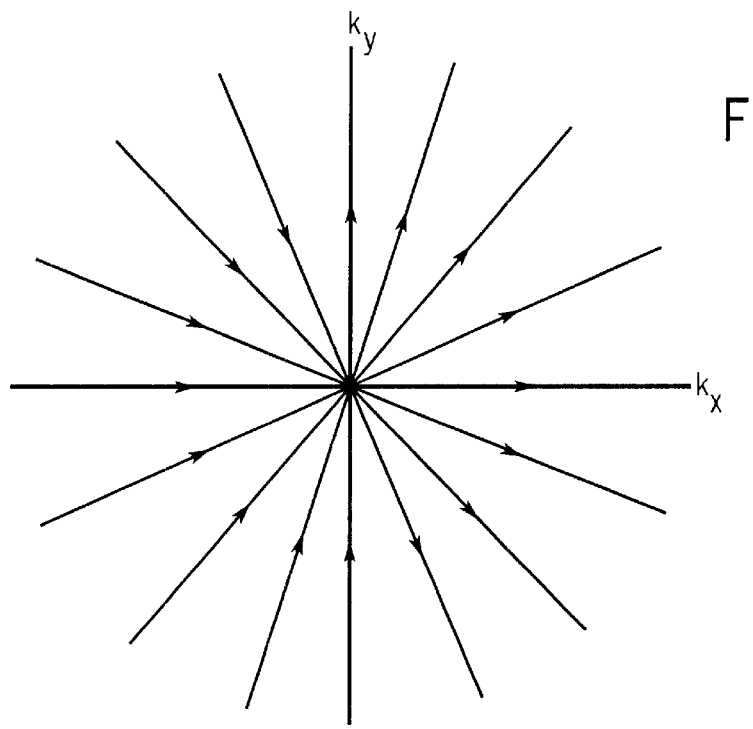
FIG. 3 is a graphic illustration of the manner in which k-space is sampled during a typical projection reconstruction image acquisition using the MRI system of FIG. 1.

As indicated above, the motion encoding gradient $G_M$ can be applied in any direction. In the preferred embodiment, the motion encoding gradient $G_M$ is applied separately along each of the gradient axes, x, y and z such that an image indicative of total spin velocity can be produced. That is, an image indicative of velocity along the z axis ($v_z$) is produced by acquiring an image with the bipolar motion encoding gradient $G_M$ added to the $G_z$ gradient waveform shown in FIG. 3, a second velocity image $V_x$ is acquired with the motion encoding gradient $G_M$ added to the $G_x$ gradient waveform, and a third velocity image $V_y$ is acquired with the motion encoding gradient $G_M$ added to the $G_y$ gradient waveform. An image indicative of the total spin velocity is then produced by combining the corresponding pixel values in the three velocity images $$V_T = \sqrt{V_x^2 + V_y^2 + V_z^2}$$

For a more detailed description of the image reconstruction process, reference is made to co-pending U.S. patent application Ser. No. 09/314,226 filed on May 18, 1999 and entitled "Phase Contrast Imaging Using Interleaved Projection Data".

The present invention may be employed in a number of different ways to produce a phase contrast MRA image. For example, the data for velocity image $V_x$ may be acquired by velocity encoding.

What is claimed is:

1. A method for producing a magnetic resonance image of a patient using a magnetic resonance imaging (MRI) system, the steps comprising:

a) operating the MRI system to acquire a k-space image data set using a three-dimensional projection reconstruction pulse sequence that is repeated to sample k-space throughout a three-dimensional k-space volume V, and wherein the three-dimensional projection reconstruction pulse sequence is repeated a sufficient number of times to sample in accordance with the Nyquist condition, a central volume of k-space that is substantially smaller than the volume V but not a sufficient number of times to sample a peripheral region of k-space in accordance with the Nyquist condition; and b) reconstructing an image using substantially the entire, undersampled acquired k-space image data set and wherein the number of repetitions of the three-dimensional projection reconstruction pulse sequence is substantially less than one-half the number of repetitions necessary to fully sample the entire k-space volume V in accordance with the Nyquist condition.

2. A method for producing a magnetic resonance image of a patient using a magnetic resonance imaging (MRI) system, the steps comprising:

a) operating the MRI system to acquire a k-space image data set using a three-dimensional projection reconstruction pulse sequence that is repeated to sample k-space thoughout a k-space volume having a radius R, and wherein the three-dimensional projection reconstruction pulse sequence is repeated a sufficient number of times to sample in accordance with the Nyquist condition, a central region of k-space having a radius r that is substantially smaller than the radius R but not a sufficient number of times to sample a peripheral region of k-space in accordance with the Nyquist condition; and b) reconstructing an image using substantially the entire, undersampled acquired k-space image data set in which step b) includes:

i) producing a three-dimensional array of k-space data by regridding the acquired k-space data set; and ii) performing a three-dimensional Fourier transformation on the three-dimensional array of k-space data; and wherein the number of repetitions of three-dimensional projection reconstruction pulse sequence is substantially less than one-half the number of repetitions necessary to fully sample the entire k-space volume in accordance with the Nyquist condition.

3. The method as recited in claim 1 in which the resolution of the reconstructed image is isotropic.

4. The method as recited in claim 1 in which the pulse sequence is performed by:

i) producing an rf excitation pulse that produces transverse magnetization in spins located throughout the field of view of the reconstructed image; and ii) acquiring an NMR signal in the presence of a readout gradient to sample k-space in a trajectory that starts at one point on an outer boundary of the sampled k-space volume, passes through the center of k-space and extends out to another point on the outer boundary of the sampled k-space volume.

5. The method as recited in claim 4 in which the sampling trajectory is a straight line.

6. The method as recited in claim 1 in which the pulse sequence is performed by:

i) producing an rf excitation pulse that produces transverse magnetization in spins located throughout the field of view of the reconstructed image;

ii) acquiring an NMR signal in the presence of a readout gradient to sample k-space in a trajectory that extends from one point on an outer boundary of the k-space volume and extends through the center of k-space; and the method further includes the step of synthesizing from the k-space samples acquired in step ii) further k-space samples that extend the trajectory to another point on the outer boundary of the k-space volume.

7. The method as recited in claim 1 in which step b) includes performing a filtered back projection image reconstruction using the k-space image data set.

8. A method for producing a magnetic resonance angiogram image of selected vasculature in a patient using a magnetic resonance imaging system (MRI), the steps comprising:

a) injecting the patient with a contrast agent which flows into the selected vasculature;

b) operating the MRI system to perform a three-dimensional projection reconstruction pulse sequence;

c) acquiring an NMR signal produced by spins in the selected vasculature to sample three-dimensional k-space volume along a trajectory that extends substantially radially from the center of k-space;

d) repeating steps b) and c) with a different readout gradient in three-dimensional projection reconstruction pulse sequence to sample the three-dimensional k-space volume along a different trajectory that extends substantially radially from the center of k-space;

e) producing an image data set by repeating step d) to sample k-space throughout a three-dimensional k-space volume with substantially uniform spacing between trajectories and with the spacing between acquired k-space samples from adjacent trajectories at the periphery of the sampled k-space volume being substantially more than twice the spacing necessary to satisfy the Nyquist condition; and f) reconstructing an image of the selected vasculature using substantially all the k-space samples in the acquired image data set.

9. A method for producing a magnetic resonance angiogram of selected vasculature in a patient using a magnetic resonance imaging system(MRI) system, the steps comprising:

a) injecting the patient with a contrast agent which flows into the selected vasculature;

b) operating the MRI system to perform a three-dimensional projection reconstruction pulse sequence;

c) acquiring an NMR signal produced by spins in the selected vasculature to sample k-space along a trajectory that extends substantially radially from the center of k-space;

d) repeating steps b) and c) with a different readout gradient in the three-dimensional projection reconstruction pulse sequence to sample k-space along a different trajectory that extends substantially radially from the center of k-space;

e) producing an image data set by repeating step d) to sample k-space throughout a three-dimensional k-space volume with substantially uniform spacing between trajectories and with the spacing between acquired k-space samples from adjacent trajectories at the periphery of the sampled k-space volume being substantially more than twice the spacing necessary to satisfy the Nyquist condition;

f) reconstructing an image of the selected vasculature using substantially all the k-space samples in the acquired image data set; and in which step f) includes:
   i) producing a three-dimensional array of k-space data by regridding the acquired k-space samples; and
   ii) performing a three-dimensional Fourier transformation on the three-dimensional array of k-space data.

10. The method as recited in claim 8 in which the resolution of the reconstructed image is isotropic throughout the selected vasculature.

11. The method as recited in claim 8 which includes:
timing the performance of steps b) through e) such that the acquired NMR signals are enhanced by the arrival of contrast agent in the selected vasculature.

12. The method as recited in claim 8 which includes, repeating steps b) through e) to acquire additional image data sets as the contrast agent flows into the selected vasculature, and step f) includes, combining k-space samples from a plurality of acquired image data sets, and reconstructing said image using the combined k-space samples.

13. The method as recited in claim 12 in which successively acquired image data sets sample different locations in k-space and k-space samples from successive image data sets are combined and used to reconstruct said image.

14. The method as recited in claim 13 in which the k-space samples from one acquired image data set are combined with peripheral region k-space samples from a successively acquired image data set.

15. The method as recited in claim 13 in which image data sets from three different and interleaved locations in k-space are successively and repeatedly acquired, and k-space samples from three successive image data sets are combined and used to reconstruct said image.

16. A method for producing a magnetic resonance angiogram of selected vasculature in a patient using a magnetic resonance imaging system (MRI) system, the steps comprising:

a) injecting the patient with a contrast agent which flows into the selected vasculature;

b) operating the MRI system to perform a three-dimensional projection reconstruction pulse sequence;

c) acquiring an NMR signal produced by spins in the selected vasculature to sample k-space along a trajectory that extends substantially radially from the center of k-space;

d) repeating steps b) and c) with a different readout gradient in the three-dimensional projection reconstruction pulse sequence to sample k-space along a different trajectory that extends substantially radially from the center of k-space;

e) producing an image data set by repeating step d) to sample k-space throughout a three-dimensional k-space volume with substantially uniform spacing between trajectories and with the spacing between acquired k-space samples from adjacent trajectories at the periphery of the sampled k-space volume being substantially more than twice the spacing necessary to satisfy the Nyquist condition; and f) repeating steps b) through e) to acquire additional image data sets as the contrast agent flows into the selected vasculature in which successively acquired image data sets sample from three different and interleaved locations in k-space g) combining k-space samples from a plurality of acquired image data sets and reconstructing an image using the combined k-space samples; and in which all the k-space samples from the second of said three successive image data sets are combined with peripheral region k-space samples from the first and the third of said three successive image data sets.

17. The method as recited in claim 16 in which the spacing between k-space samples in a central region of each image data set satisfies the Nyquist condition.

18. The method as recited in claim 12 in which the three-dimensional projection reconstruction pulse sequence produces a velocity encoding gradient;

successively acquired image data sets are velocity encoded for spin motion along different axes; and k-space samples from successively acquired image data sets are combined and used to reconstruct said image.

19. The method as recited in claim 18 in which image data sets with three different velocity encoding directions are successively acquired, and k-space samples from three successive image data sets are combined and used to reconstruct said image.

20. The method as recited in claim 13 in which the radial k-space sampling trajectories of the different image data sets are interleaved.

21. The method as recited in claim 8 in which the k-space sampling trajectories acquired in step c) extend from the center of k-space in substantially opposite directions therefrom and to substantially opposite points on an outer boundary of the sampled k-space volume.

22. A method for producing a magnetic resonance angiogram image of selected vasculature in a patient using a magnetic resonance imaging system (MRI), the steps comprising:

a) injecting the patient with a contrast agent which flows into the selected vasculature;

b) operating the MRI system to perform a three-dimensional projection reconstruction pulse sequence;

c) acquiring an NMR signal produced by spins in the selected vasculature to sample a three-dimensional k-space volume along a trajectory that extends substantially radially from the center of k-space;

d) repeating steps b) and c) a plurality of times with a different readout gradient in the three-dimensional projection reconstruction pulse sequence each repetition to sample a first set of trajectories;

e) repeating steps b) and c) a plurality of time with a different readout gradient in each repetition to sample a second set of trajectories;

f) repeating steps b) and c) a plurality of times with a different readout gradient in each repetition to sample a third set of trajectories;

g) combining sampled k-space data in the second set of trajectories with sampled k-space data from the first and third sets of trajectories that is located in a peripheral region of said three-dimensional k-space volume; and h) reconstructing an image of the selected vasculature using the combined k-space data.

23. The method as recited in claim 22 which includes performing step e) at an optimal moment when the contrast flows into said selected vasculature.

* * * * *

UNITED STATES PATENT AND TRADEMARK OFFICE
CERTIFICATE OF CORRECTION

PATENT NO.     : 6,487,435 B2
DATED          : November 26, 2002
INVENTOR(S)    : Mistretta et al.

It is certified that error appears in the above-identified patent and that said Letters Patent is hereby corrected as shown below:

<u>Column 11,</u>
Line 38, "by in" should be -- by "-" in --.

<u>Column 13,</u>
Line 34, "thoughout" should be -- throughout --.

<u>Column 16,</u>
Lines 64-65, "contrast flows" should be -- contrast agent flows --.

Signed and Sealed this

Twenty ninth Day of April, 2003

JAMES E. ROGAN
*Director of the United States Patent and Trademark Office*